United States Patent [19]

Shiozaki et al.

[11] Patent Number: 5,468,919
[45] Date of Patent: Nov. 21, 1995

[54] PRINTED CIRCUIT BOARD DEVICE WITH SURFACE-MOUNTED BAR-LIKE CONNECTORS

[75] Inventors: Minoru Shiozaki, Inazawa; Mikio Yasuda, Ichinomiya; Isamu Chimoto, Nishikasugai; Kameki Ishimoto, Ichinomiya, all of Japan

[73] Assignee: Matsushita Electric Industrial Co., Ltd., Osaka, Japan

[21] Appl. No.: 226,666

[22] Filed: Apr. 12, 1994

[30] Foreign Application Priority Data

Apr. 12, 1993 [JP] Japan .................................. 5-084547

[51] Int. Cl.⁶ .................................................. H05K 1/18
[52] U.S. Cl. .......................... 174/261; 174/260; 361/767; 361/768
[58] Field of Search .................................. 174/261, 250, 174/260; 361/767, 778, 768

[56] References Cited

U.S. PATENT DOCUMENTS 4,339,785  7/1982  Ohsawa ................................ 361/411
4,870,225  9/1989  Anao et al. .......................... 174/68.5

FOREIGN PATENT DOCUMENTS 4-283990  10/1992  Japan .

*Primary Examiner*—Laura Thomas
*Attorney, Agent, or Firm*—Ratner & Prestia

[57] ABSTRACT

A printed circuit board device comprises bar-like connectors made of a metal material and having a predetermined length and a predetermined width. Each bar-like connector has a plating of a highly electrically conductive, anti-corrosion metal coated over the side surface(s) thereof but not the end surfaces. Each bar-like connector may be more smooth on the side surface(s) than on the end surfaces. Each bar-like connector is fixedly connected at both ends by an electrically conductive bonding agent to a pair of lands on a printed circuit board, respectively, to provide electrical conduction between the two lands. Accordingly, connection faults caused by the Manhattan phenomenon are eliminated and the cost of SMT production is reduced.

22 Claims, 3 Drawing Sheets

PRINTED CIRCUIT BOARD DEVICE WITH SURFACE-MOUNTED BAR-LIKE CONNECTORS

BACKGROUND OF THE INVENTION

1. Field of the Invention

The present invention relates to printed circuit board devices for use with a variety of electronic apparatuses and more particularly, a surface-mount printed circuit board device carrying bar-like connectors each disposed between a pair of lands on a printed circuit board for electrical conduction.

2. Description of the Prior Art

It is known that advanced surface-mount technologies (SMT) are widely employed for achievement of high density circuitry arrangements. Each electronic chip-on-board (COB) or chip component having electrode terminals provided at both ends of its package is soldered onto a printed circuit board. This is different compared with a conventional lead-through mounting method utilizing electronic components with lead wires extending from their packages for connecting and mounting. As shown in FIG. 7, SMT may use chip resistors of lower resistance, in place of jumpers in the conventional lead-through mounting method, for electrical conduction between two lands on a printed circuit board. There is, for example, a chip resistor 6 having two electrodes 4 and 5 provided at both ends thereof and soldered to and between a pair of lands 2 and 3 of a printed circuit board 1. This is accomplished by placing the chip resistor 6 on the lands 2 and 3 on which amounts of solder paste are applied (e.g. by screen printing process), melting the solder paste using a reflowing process, and solidifying the solder by cooling so that the two electrodes 4 and 5 are soldered to the two lands 2 and 3 respectively. Also, a circuit pattern 7 extends between the two lands 2 and 3 or the two electrodes 4 and 5. Two portions 8 and 9 of the solder paste are applied to bond the two electrodes 4 and 5 of the chip resistor 6 to the lands 2 and 3 respectively.

While the chip resistor 6 is adapted to electrically conduct between the lands 2 and 3 on the printed circuit board 1 carrying the circuit pattern 7 (which is not finished at the surface with resist coating), its package between the two electrodes 4 and 5 is electrically insulated thus producing no short-circuit. However, the chip resistor 6 of this type is more costly than common jumpers. Also, the reflowing process is likely to create a Manhattan phenomenon (illustrated in FIG. 8) in which the chip resistor 6 is lifted up when the solder paste at one of the lands 2 and 3, herein 8 as illustrated, swells upon being heated and seizes the end surface 4a of the electrode 4 of the chip resistor 6. This causes a surface tension which draws the end surface 4a towards the land 2. Consequently, electrode 5 of the chip resistor 6 disconnects from the land 3, thus interrupting the electrical connection. Thus, after the reflowing process of the SMT, it is desirable for a printed circuit board device to be subjected to an appearance test and/or in-circuit test to verify the integrity of all electrical conductions. This results in an increase of the production cost as fault conducting components have to be identified and respectively corrected by workers.

A proposed method of eliminating Manhattan phenomenon is disclosed in Japanese Patent Application Openlaying No. Hei4-283990 which is incorporated herein by reference. According to the proposed method, the width of a land on a printed circuit board is made smaller than that of the electrodes of a chip component to be mounted. As a smaller amount of solder paste is used, seizure of the entire end surface of the electrode is minimized, thus eliminating Manhattan phenomenon. However, the method still utilizes highly priced chip components with two electrodes at both sides and may not reduce the overall production cost to an appreciable level.

SUMMARY OF THE INVENTION

A printed circuit board device comprises bar-like connectors made of a highly electrically conductive metal material and having a predetermined length and a predetermined width. Each bar-like connector is fixedly connected at both ends by an electrically conductive bonding agent to a pair of lands on a printed circuit board, respectively, to provide electrical conduction between the two lands. The electrically conductive bonding agent for bonding the bar-like connector between the two lands may be selected from solder and an electrically conductive adhesive, depending on the application, procedure, or purpose. The bar-like connector may be fabricated by cutting a wire of a metal material coated with a plating of a highly electrically conductive, anti-corrosion metal, which thus is hardly affected by acid, to a predetermined length so that it can bridge between the two lands. The printed circuit board device of the present invention utilizes the foregoing bar-like connectors in place of conventional high priced chip resistors, thus reducing the production cost. Also, even if a commercially available solder, or an electrically conductive adhesive, is used as the electrically conductive bonding agent for bonding each bar-like connector between the two lands, unwanted Manhattan phenomenon (which is common in the surface mounting of conventional chip components) is eliminated. Thus, in-process defects are minimized.

DETAILED DESCRIPTION OF THE INVENTION

Preferred embodiments of the present invention will be described in detail referring to the accompanying drawings.

EXAMPLE 1

Figure 1:
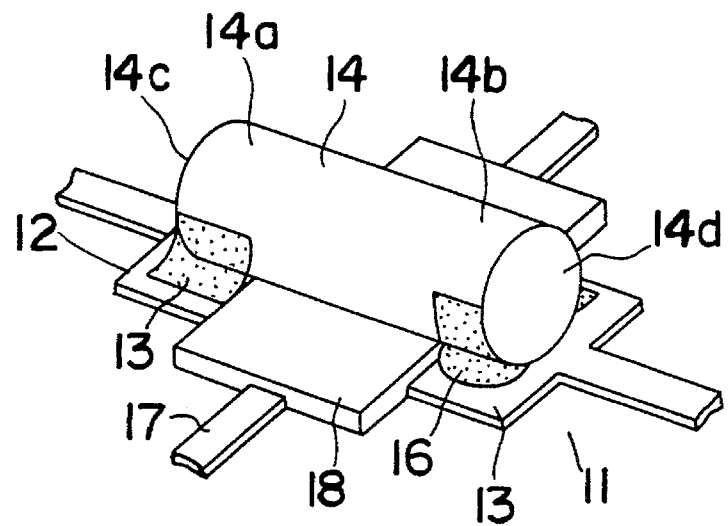
FIG. 1 is a perspective view of a primary part of a printed circuit board device showing a first exemplary embodiment of the present invention.
Figure 2:
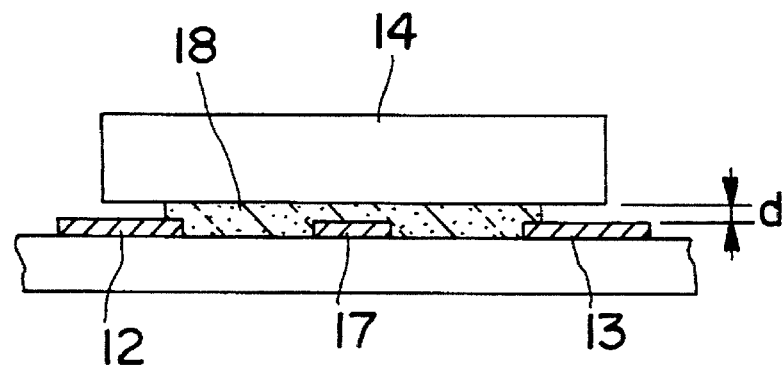
FIG. 2 is a cross sectional view of the device shown in FIG. 1.
Figure 3:
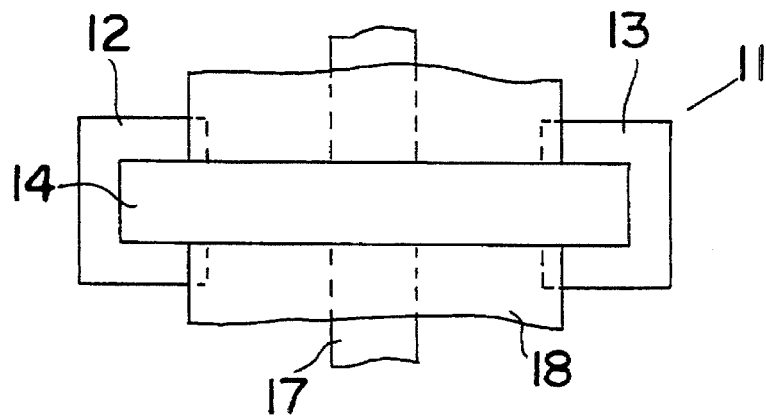
FIG. 3 is a plan view of the device shown in FIG. 1.

FIGS. 1, 2 and 3 are a perspective view, a cross sectional view, and a plan view, respectively, showing a primary part of a printed circuit board device according to a first exemplary embodiment of the present invention. As shown in FIGS. 1 and 2, a pair of lands 12 and 13 to be connected on a printed circuit board 11 are coated at their surfaces with solder paste using a known screen printing process. A bar-like connector 14 made of brass and having a predetermined length (and 0.6 mm in diameter) is placed over and between the two lands 12 and 13. By subjecting the solder paste to a reflowing process, the bar-like connector 14 is boned with one end 14a thereof by a portion 15 of the solder paste to the land 12 and the other end 14b by another portion 16 of the solder paste to the land 13 to provide electrical conduction between the two lands 12 and 13.

In this exemplary embodiment of the present invention, the bar-like connector 14 is fabricated by cutting a long brass material to an appropriate length with the use of an appropriate cutter means. In that case, the bar-like connector 14 may have its cut surfaces 14c and 14d burred. The burred surfaces 14c and 14d are typically not directly touching the solder paste. The solder pastes 15 and 16 are well distributed to form two smooth surfaces at the end regions 14a and 14b of the bar-like connector 14 respectively. This causes surface tension to hold the bar-like connector 14 tightly. Thus, the Manhattan phenomenon is avoided. As the result, compensation for the Manhattan phenomenon after soldering is not needed. It is also desirable to subject the cut surfaces 14c and 14d to a coarse finish process after cutting.

The bar-like connector 14 may be cut to an appropriate length just before mounting between the two lands. After being cut, the cut surfaces at both ends may be coarsely finished.

As shown in FIGS. 1, 2, and 3, part of a circuit pattern 17 is disposed between the two lands 12 and 13. A resist 18 is arranged across and over the circuit pattern 17 to extend up to and cover inwardly edge regions of both the lands 12 and 13. In particular, a distance d is produced between the lower surface of the bar-like connector 14 and the upper surfaces of the lands 12 and 13 for ease of soldering, as shown in FIG. 2. This distance d also provides electrical insulation between the bar-like connector 14 and the circuit pattern 17.

EXAMPLE 2

Figure 4:
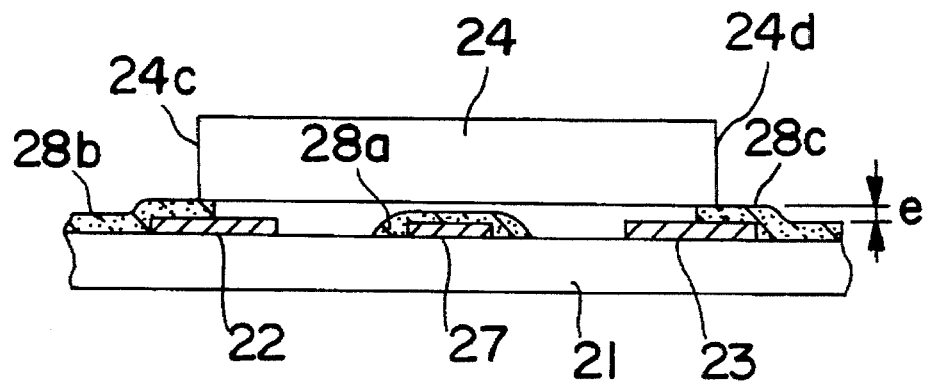
FIG. 4 is a cross sectional view of a printed circuit board device showing a second exemplary embodiment of the present invention.
Figure 5:
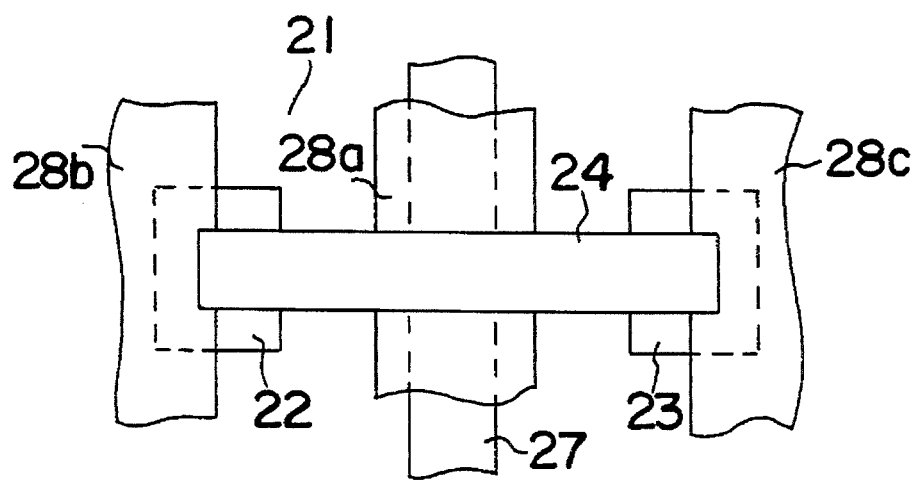
FIG. 5 is a plan view of the device shown in FIG. 4.

FIGS. 4 and 5 are a cross sectional view and a plan view, respectively, of a primary part of another printed circuit board device showing a second exemplary embodiment of the present invention. As shown, there are a pair of lands 22 and 23 disposed opposite to each other on a printed circuit board 21. The two opposite lands 22 and 23 are partially covered at their outward ends with resists 28b and 28c, respectively, for electrical insulation. Also, a resist 28a is arranged across and over a part of a circuit pattern 27 between the two lands 22 and 23. The two lands 22 and 23 are coated at their surfaces with solder paste. A bar-like connector 24 fabricated by cutting a long brass material to a predetermined length is disposed over and between the two resists 28b and 28c and soldered by a reflowing process at both ends to the two lands 22 and 23. As shown in FIG. 4, the lower surface of the bar-like connector 24 is spaced from the upper surfaces of the lands 22 and 23 by a distance e which is equal to the thickness of the resists 28b and 28c. In this manner, the bar-like connector 24 is electrically insulated from the circuit pattern 27. The overall length of the bar-like connector 24 is greater than the distance between the two edges of the exposed regions of their respective lands 22 and 23. This allows allowing both end surfaces 24a and 24d of the bar-like connector 24 to be free from solder paste. Consequently, the Manhattan phenomenon is avoided.

EXAMPLE 3

Figure 6:
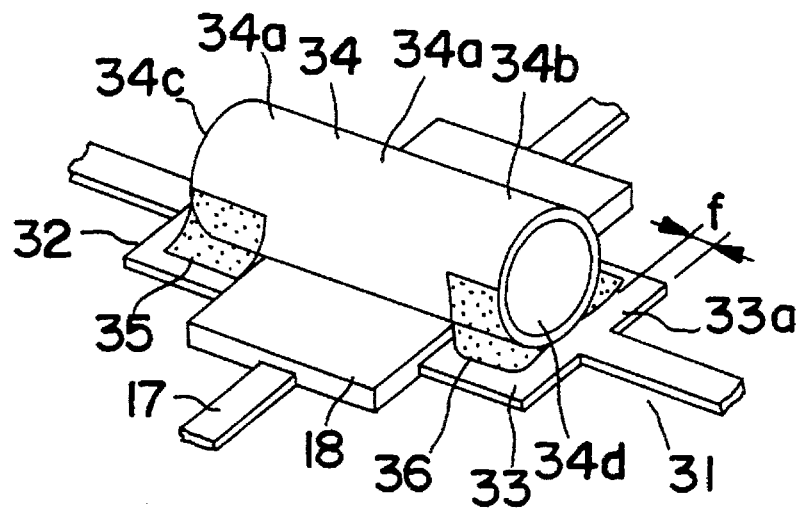
FIG. 6 is a perspective view of a primary part of a printed circuit board device showing a third exemplary embodiment of the present invention.
Figure 7:
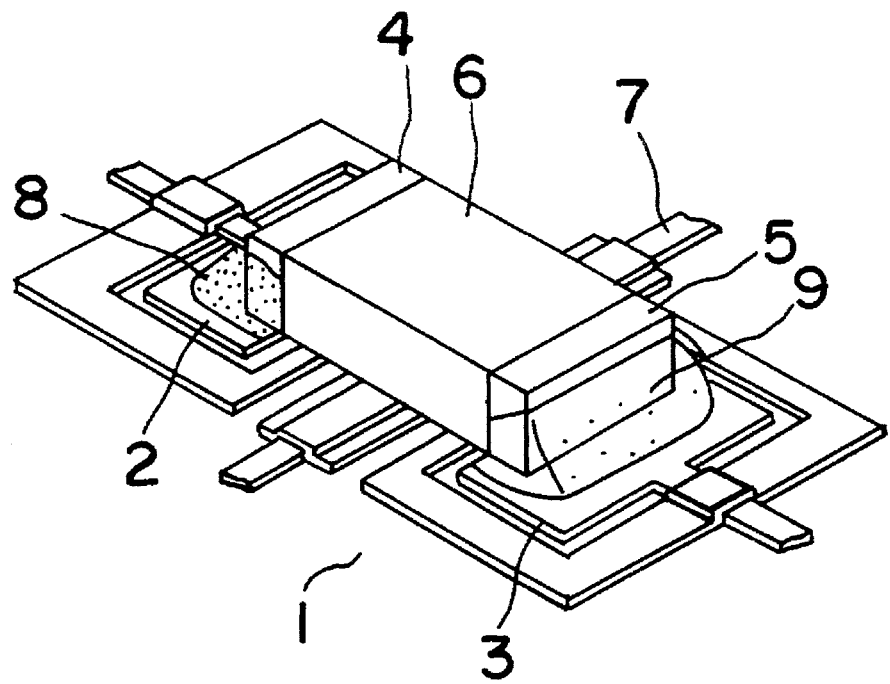
FIG. 7 is a perspective view of a primary part of a prior art printed circuit board device.
Figure 8:
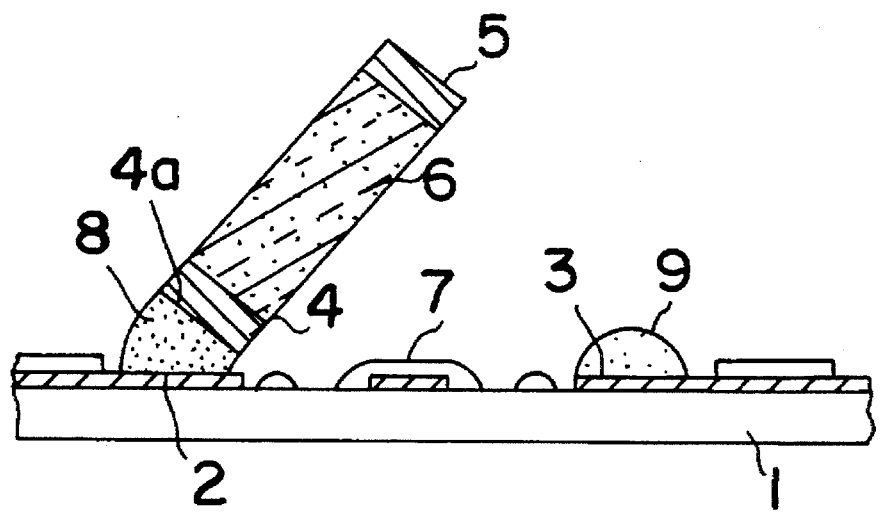
FIG. 8 is a cross sectional view illustrating disadvantages of the prior art.

FIG. 6 is a perspective view of a primary part of a further printed circuit board device showing a third exemplary embodiment of the present invention. The arrangement of the third embodiment is similar to that of the first embodiment except for the shape and material of the bar-like connector. As shown in FIG. 6, a bar-like connector 34 fabricated of a ferrous bar coated at the entire surface (except both end surfaces 34c and 34d) with a layer of silver plating is disposed over and between a pair of lands 32 and 33 to which solder paste is applied. As the solder paste is melted through a reflowing process, the two end regions 34a and 34b of the bar-like connector 34 are bonded by portions 35 and 36 of the solder paste to the two opposite lands 32 and 33, respectively, to provide electrical conduction between the two lands 32 and 33. The end surfaces 34c and 34d of the bar-like connector 34 are kept free from solder paste and are not covered with the silver plating. The ferrous material of the bar-like connector 34 of the third exemplary embodiment is low in cost but relatively low in the electrical conductivity. This is compensated by the silver plating on the steel material which has a substantially high electrical conductivity. As the result of the skin effect, the bar-like connector 34 has a higher conductivity which increases the frequency characteristics.

The core material of the bar-like connector 34 is not limited to ferrous material but may be copper, brass, aluminum, or other appropriate metal. Also, the plating on the core material is not limited to silver plated but may be of tin, zinc, copper, gold, paradium, or their combination or alloy, e.g. silver-paradium or solder of tin-zinc, which is high in electrical conductivity and resistance to corrosion.

When the layer of metal or alloy plating is more intimate with the solder than the core material, the soldering of the bar-like connector to the lands is increased in effectiveness and efficiency. The method of making the layer of plating may be selected from common wet plating techniques including electric plating, chemical plating as well as dry plating techniques including chemical vapor deposition, electric beam irradiation, and plasma-activated process, depending on the core material and the available cost. The bar-like connector 34 may efficiently be fabricated in industrial production by cutting a long material to a predetermined length with, for example, an automatic cutter. The resultant cut surfaces 34c and 34d are burred and not smooth while not being covered with plating, thus preventing the solder paste from sticking thereto during soldering. The bar-like connector 34 is successfully soldered with its end regions 34a and 34b to the lands 32 and 33, respectively, without creating the Manhattan phenomenon.

Although each of the bar-like connectors according to the first, second, and third exemplary embodiments of the present invention is disposed between a pair of lands and soldered to the pair of lands through a reflowing process, it may temporarily be tacked with its sides by an applicable bonding agent to a printed circuit board and then dipped in a melted solder bath for bonding. In this case, it should be noted that the metal material of the plating on the bar-like connector 34 is a desirable metal or alloy which is higher in melting point that the solder, such as zinc, silver, gold, paradium, or silver-paradium alloy. This prevents the bar-like connectors from dropping off into the solder bath.

Referring back to FIG. 6, the end surface 34d of the bar-like connector 34 is spaced by a distance f from the outward edge of an exposed region 33a of the land 33. The smaller the distance f, the less the amount of solder paste to be used at the land 33 during soldering. Thus, the minimal use of solder paste will help to prevent the Manhattan phenomenon.

As set forth above with regard to each exemplary embodiment, the bar-like connectors are each bonded with two ends thereof to the corresponding lands by soldering to provide electrical conduction between the lands. The present invention is not limited, however, to soldering. The bonding of the two ends of each bar-like connector to the corresponding lands may be carried out using an electrically conductive adhesive agent. The electrically conductive adhesive agent may be a mixture of a binder and an electrically conductive material. Preferably, the binder is selected from a heat-resistance thermosetting resin and a low melting point glass. The electrically conductive material is selected from graphite, silver, silver-plated carbon black, copper, and silver-paradium alloy in powder form.

In preparation, a proper amount of the electrically conductive material is added to the binder thus producing a mixture adhesive. Similar to soldering, the bar-like connector is preferably fabricated by cutting a long metal wire form which is covered at its surface with a plating of a high conductive, anti-corrosion metal or alloy. In production, appropriate amounts of the electrically conductive adhesive agent are applied to both ends of the bar-like connector and the two corresponding lands before heated up and cooled down for setting. The advantage of using a binder which is higher in the melting point or decomposing temperature than the solder is that the bonding of the bar-like connectors to the lands with the adhesive can be followed by surface mounting of other chip components with the use of soldering.

As illustrated in the perspective views of FIGS. 1 and 6, the shape of the bar-like connector in the printed circuit board device of each embodiment is round in cross section. This round cross section may be advantageous by the fact that two applicable spaces at both sides of the bar-like connector are produced between the lower half of the bar-like connector and the upper surface of each corresponding land for accommodating amounts of the solder. As the spaces are narrow, a resultant capillary action causes the solder to move effectively between the lower half of the bar-like connector and the corresponding land. It is understood that the cross section of the bar-like connector is not limited to the round shape particularly when an electrically conductive adhesive agent is used for bonding.

What is claimed:

1. A printed circuit board device comprising:

a bar-like connector made of a high electrically conductive metal material;

said bar-like connector smoother on a side surface than on end surfaces thereof;

said bar-like connector connected primarily at a portion of the side surface adjacent each end by connectors of an electrically conductive bonding agent to a pair of lands, respectively, on said printed circuit board.

2. A printed circuit board device according to claim 1, wherein the electrically conductive bonding agent is solder.

3. A printed circuit board device according to claim 1, wherein the electrically conductive bonding agent is a heat-resistant adhesive.

4. A printed circuit board device according to claim 1, wherein said bar-like connector is protected with a resist which is integrally formed to extend over a part of a circuit pattern extending between the pair of lands and to cover inward regions of the pair of lands.

5. A printed circuit board device according to claim 1, wherein said bar-like connector is protected with resists which cover a part of a circuit pattern extending between the pair of lands and parts of outward regions of the pair of lands, respectively.

6. A printed circuit board device according to claim 1 wherein the bar-like connector is a predetermined length of wire of a highly electrically conductive material.

7. A printed circuit board device comprising:

a bar-like connector made of a metal material, said bar-like connector having a plating of a high electrically conductive, anti-corrosion metal coated over a side surface thereof and not end surfaces thereof and fixedly connected at both ends by an electrically conductive bonding agent to a pair of lands, respectively, on a printed circuit board.

8. A printed circuit board device according to claim 7 wherein the electrically conductive bonding agent is solder.

9. A printed circuit board device according to claim 8 wherein the bar-like connector is a predetermined length cut from a wire of a metal material.

10. A printed circuit board device according to claim 8 wherein the bar-like connector is cut from a wire of the metal material coated with the plating of the high electrically conductive, anti-corrosion solderable metal having a melting point higher than that of solder.

11. A printed circuit board device according to claim 7 wherein the electrically conductive bonding agent is a heat-resistant adhesive which is resistant to the heat of melting solder.

12. A printed circuit board device according to claim 11 wherein said bar-like connector is a predetermined length cut from a wire of the metal material.

13. A printed circuit board device according to claim 7 wherein said bar-like connector is protected with a resist which is integrally formed to extend over a part of a circuit pattern extending between the pair of lands and which covers inward regions of the pair of lands.

14. A printed circuit board device according to claim 13 wherein said bar-like connector is a predetermined length cut from a wire of the metal material.

15. A printed circuit board device according to claim 7 wherein said bar-like connector is protected with resists which cover a part of a circuit pattern extending between the pair of lands and outward regions of the pair of lands.

16. A printed circuit board device according to claim 15 wherein said bar-like connector is a predetermined length cut from a wire of the metal material.

17. A printed circuit board device according to claim 7 wherein said bar-like connector is a predetermined length cut from a wire of the highly electrically conductive material.

18. A printed circuit board device according to claim 7 wherein said bar-like connector is a predetermined length cut from a wire of the metal material coated with a plating of the highly electrically conductive, anti-corrosion metal.

19. A printed circuit board device according to claim 7 wherein said bar-like connector is coated at the side surface but not the end surfaces thereof with the plating of the highly electrically conductive, anti-corrosion, metal.

20. A printed circuit board device according to claim 7 wherein said bar-like connector is coated at a side surface thereof but not end surfaces thereof with the plating of the highly electrically conductive, anti-corrosion solderable metal having a melting point higher than that of solder.

21. A printed circuit board comprising:

a bar-like connector made of a high electrically conductive metal material;

said bar-like connector having a smooth side surface and a coarse end surface;

said bar-like connector connected primarily at each end of a side surface by connectors of an electrically conductive heat melting bonding agent to a pair of lands, respectively, on said printed circuit board.

22. A printed circuit board device comprising:

a bar-like connector made of a metal material;

said bar-like connector having a plating of a high electrically conductive, anti-corrosion metal coated over a side surface thereof and coarse uncoated end surfaces thereof and fixedly connected primarily at both ends of a side surface by an electrically conductive heat melting bonding agent to a pair of lands, respectively, on said printed circuit board.

* * * * *